(12) United States Patent
Tabata et al.

(10) Patent No.: US 12,308,241 B2
(45) Date of Patent: May 20, 2025

(54) PLASMA PROCESSING METHOD AND PLASMA PROCESSING APPARATUS

(71) Applicant: TOKYO ELECTRON LIMITED, Tokyo (JP)

(72) Inventors: Masahiro Tabata, Miyagi (JP); Sho Kumakura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 577 days.

(21) Appl. No.: 17/560,228

(22) Filed: Dec. 22, 2021

(65) Prior Publication Data

US 2022/0115241 A1 Apr. 14, 2022

Related U.S. Application Data

(62) Division of application No. 16/521,080, filed on Jul. 24, 2019, now Pat. No. 11,239,090.

(30) Foreign Application Priority Data

Jul. 25, 2018 (JP) .................................. 2018-139450
May 24, 2019 (JP) .................................. 2019-097691

(51) Int. Cl.
*H01L 21/311* (2006.01)
*H01L 21/02* (2006.01)

(52) U.S. Cl.
CPC .. *H01L 21/31116* (2013.01); *H01L 21/02164* (2013.01); *H01L 21/0217* (2013.01); *H01L 21/02274* (2013.01); *H01L 21/0228* (2013.01)

(58) Field of Classification Search
None
See application file for complete search history.

(56) References Cited

U.S. PATENT DOCUMENTS

2008/0061029 A1   3/2008 Lai et al.
2011/0244686 A1  10/2011 Aso et al.
(Continued)

OTHER PUBLICATIONS

Chen et al. "Effect of Alternating Ar and SF6/C4F8 Gas Flow in Si Nano-Structure Plasma Etching", found in Web page: https://tsapps.nist.gov/publication/get_pdf.cfm?pub_id=906648, also published as Microelectronic Engineering vol. 88, Issue 8, Aug. 2011, pp. 2470-2473.

(Continued)

*Primary Examiner* — Parviz Hassanzadeh
*Assistant Examiner* — Tiffany Z Nuckols
(74) *Attorney, Agent, or Firm* — XSENSUS LLP

(57) ABSTRACT

A substrate processing apparatus includes: a chamber having at least one gas inlet and at least one gas outlet; a substrate support disposed in the chamber; and a controller. The controller causes (a) placing a substrate on the substrate support, the substrate including a base layer and a first layer formed on the base layer; (b) etching the first layer to form a recess in the first layer; (c) when determined that the recess satisfies a predetermined condition, forming a first film on a bottom surface of the recess by forming an inhibitor on the bottom surface of the recess, a predetermined gas species being not adsorbed to the first film; (c) after (b), forming a second film on a side wall of the recess using the predetermined gas species as a precursor gas; and (d) etching the first layer through the recess.

19 Claims, 10 Drawing Sheets

(56) References Cited

U.S. PATENT DOCUMENTS

| | | |
|---|---|---|
| 2014/0220758 A1 | 8/2014 | Mauder et al. |
| 2015/0235860 A1* | 8/2015 | Tomura ................ H01L 21/311 |
| | | 438/694 |
| 2017/0140983 A1 | 5/2017 | Leschkies et al. |
| 2017/0148642 A1 | 5/2017 | Wang et al. |
| 2017/0338120 A1* | 11/2017 | Kobayashi ........ H01L 21/28512 |
| 2019/0164828 A1* | 5/2019 | Khaderbad ........... H01L 23/485 |

OTHER PUBLICATIONS

Donnelly et al. "Plasma etching: Yesterday, today, and tomorrow", J. Vac. Sci. Technol. A, vol. 31, No. 5, Sep./Oct. 2013.
Woo-Hee Kim, et al. "A Process for Topographically Selective Deposition on 3D Nanostructures by Ion Implantation" ACS Nano, vol. 10, 2015, 10, pp. 4451-4458.

* cited by examiner

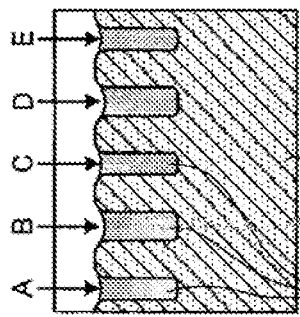
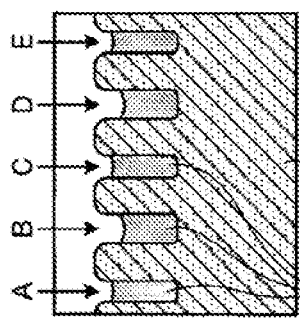
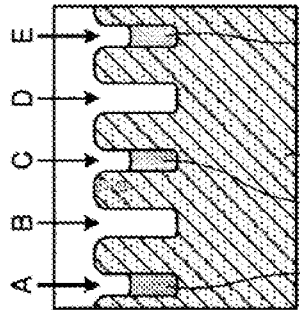
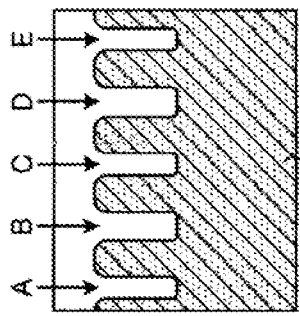
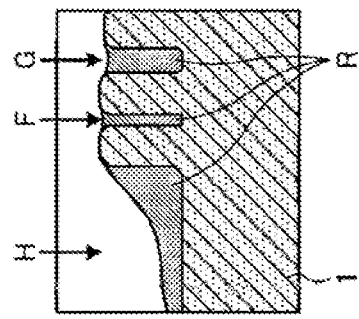
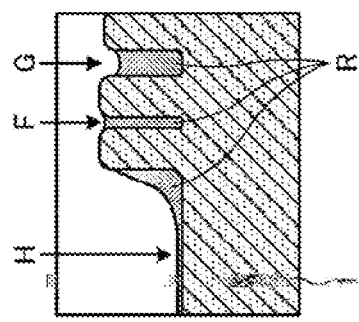
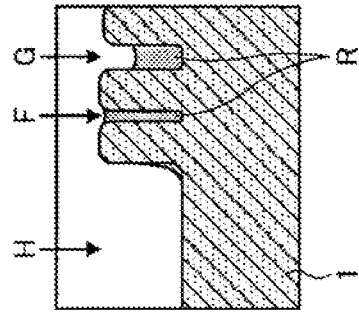
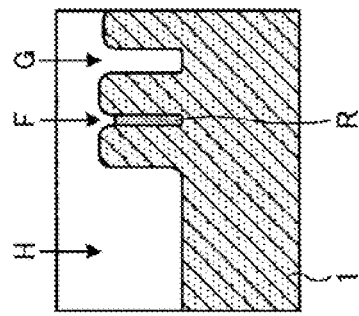

PLASMA PROCESSING METHOD AND PLASMA PROCESSING APPARATUS

CROSS-REFERENCE TO RELATED APPLICATION

This application is a divisional application of U.S. patent application Ser. No. 16/521,080, filed on Jul. 24, 2019, which claims priority from Japanese Application Nos. 2018-139450 and 2019-097691, filed on Jul. 25, 2018 and May 24, 2019 with the Japan Patent Office, respectively, all of which are incorporated herein in their entirety by reference and priority is claimed to each.

TECHNICAL FIELD

The following disclosure relates to a plasma processing method and a plasma processing apparatus.

BACKGROUND

Various techniques including atomic layer deposition (ALD) have been used to form a semiconductor device pattern. For example, there has been proposed a method using ALD such that film formation is selectively promoted according to the position of an opening formed in a substrate (US Patent Laid-Open Publication No. 2017/0140983). In addition, there has been proposed a method of selectively forming a self-assembled monolayer (SAM) and then performing gas phase etching (US Patent Laid-Open Publication No. 2017/0148642). Furthermore, there has been proposed a method for implementing selective film formation on a 3D nanostructure using ion implantation (Woo-Hee Kim, et al., "A Process for Topographically Selective Deposition on 3D Nanostructures by Ion Implantation" ACS Nano 2016, 10, 4451-4458).

SUMMARY

A plasma processing method executed by a plasma processing apparatus according to an aspect of the present disclosure includes an opening formation step, a first film formation step, a second film formation step, and an etching step. In the opening formation step, the plasma processing apparatus performs etching on a substrate including a base layer and a first layer formed on the base layer to form an opening in the first layer. When determined that the opening satisfies a predetermined condition, in the first film formation step, the plasma processing apparatus forms an inhibitor on a bottom surface of the opening through chemical vapor deposition (CVD) to form a first film to which a predetermined gas species is not adsorbed. After the formation of the first film, the plasma processing apparatus forms a second film on a side wall of the opening. The plasma processing apparatus also performs etching on the substrate through the opening in the etching step.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

BRIEF DESCRIPTION OF THE DRAWINGS

FIGS. 8A to 8D are views for explaining an example of a method of forming an inhibitor layer using capillary condensation.

DETAILED DESCRIPTION

In the following detailed description, reference is made to the accompanying drawings, which form a part thereof. The illustrative exemplary embodiments described in the detailed description, drawings, and claims are not meant to be limiting. Other exemplary embodiments may be utilized, and other changes may be made without departing from the spirit or scope of the subject matter presented here.

Hereinafter, embodiments disclosed herein will be described in detail based on the accompanying drawings. The embodiments are not limited. In addition, it is possible to appropriately combine respective embodiments in the range in which the processing contents thereof do not contradict each other.

<Incubation Mechanism>

Before describing a plasma processing apparatus and a plasma processing method according to an embodiment, an incubation mechanism will be described first.

In a film formation processing such as, for example, chemical vapor deposition (CVD), it has been known that film formation does not start immediately after the supply of a gas starts, and there may be a time in which nothing is formed until film formation actually starts. The delay occurring until the actual film formation start is called incubation, and the delay time is called incubation time. It is believed that there are various reasons for the incubation to occur. In the case of ALD, incubation occurs, for example, when a factor that inhibits film formation (hereinafter, also referred to as "inhibitor") is present on the surface of a substrate.

Figure 2A:
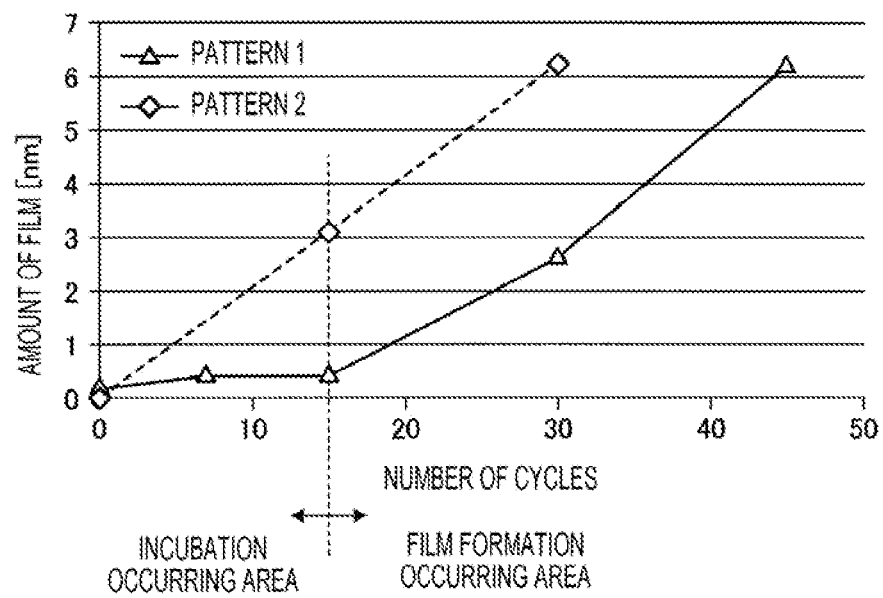
FIG. 2A is a view for explaining an example of incubation time.

FIG. 2A is a diagram for describing an example of incubation time. In the example of FIG. 2A, first, a fluorocarbon (hereinafter referred to as "FC") polymer layer was formed on the substrate by performing CVD using $C_4F_6$ gas for 10 seconds on a substrate of $SiO_2$. Thereafter, an ALD cycle was performed multiple times using a gas X containing silicon as a precursor gas and $CO_2$ gas as a reaction gas (pattern 1). In addition, as a comparative example, a test was performed in which only the ALD cycle was performed multiple times without performing CVD (pattern 2). The vertical axis in FIG. 2A represents the thickness of a film formed on a substrate, and the horizontal axis represents the number of performed ALD cycles.

As indicated by a solid line in FIG. 2A, in the case of pattern 1, film formation is hardly performed until about 15 cycles after the start of the ALD cycle, and film formation starts after about 15 cycles. In contrast, as indicated by a dotted line in FIG. 2A, in the case of pattern 2, the film formation proceeds from the first cycle after the ALD cycle starts. That is, when the ALD cycle is performed after CVD as in pattern 1, a period corresponding to the first 15 cycles is the incubation time.

Figure 2B:
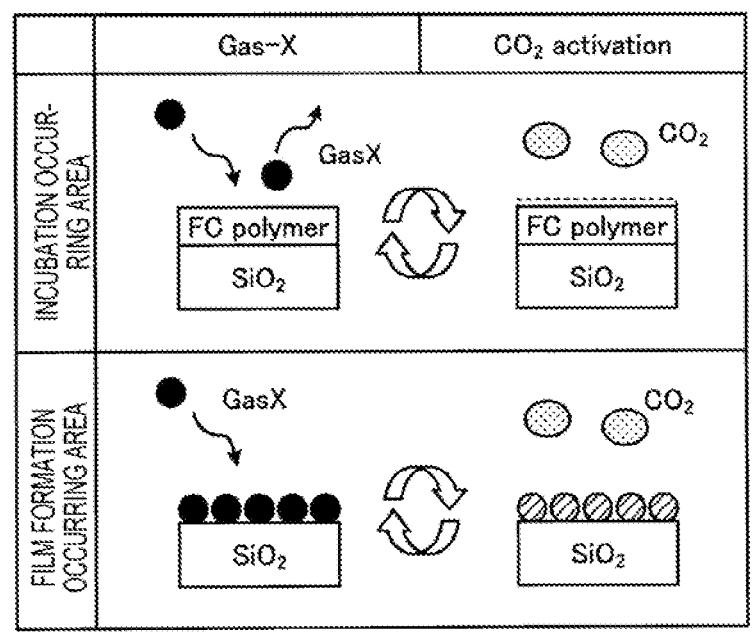
FIG. 2B is a view for explaining an example of an incubation mechanism.

FIG. 2B is a diagram for describing an example of the mechanism of incubation. A mechanism by which incubation occurs in the case of pattern 1 will be described with reference to FIG. 2B. The upper drawing of FIG. 2B illustrates the state of a substrate in the area where the incubation is occurring, and the lower drawing illustrates the state of the substrate in the area where the film formation is occurring. As illustrated in the upper left, when a fluorocarbon polymer layer (FC polymer) is formed on the substrate ($SiO_2$), a precursor gas X (Gas-X) cannot be chemically adsorbed to the polymer layer, and is purged without being adsorbed. As illustrated in the upper right, a reaction gas ($CO_2$ gas) introduced thereafter does not form a film because there is no constituent element capable of being bonded onto the polymer layer. In such a case, although it is impossible to perform film formation even if the ALD cycle is performed, the polymer layer is gradually consumed by the plasma generated from the $CO_2$ gas. By repeating the ALD cycle, it is possible to finally remove the polymer layer from the substrate.

When the polymer layer is removed from the substrate, the precursor gas X is capable of being adsorbed to the $SiO_2$ exposed on the surface, as illustrated in the lower left of FIG. 2B. Then, as illustrated in the lower right, the constituent elements of the precursor gas X adsorbed on the substrate and the constituent elements of the reaction gas $CO_2$ gas introduced next are bonded to each other, so that film formation starts on the substrate.

As described above, when a factor that inhibits the adsorption of the precursor gas on the substrate exists, an incubation time occurs.

<Application to Substrate Having Pattern>

Figure 3A:
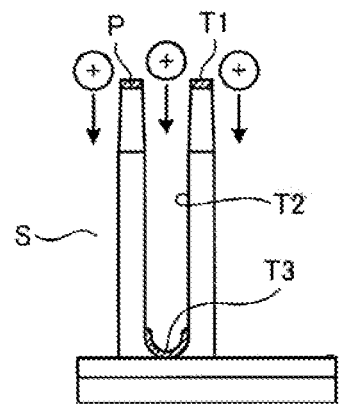
FIG. 3A is a view for explaining an example (1) of processing a substrate using incubation.
Figure 3B:
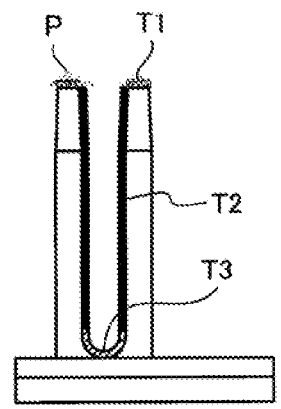
FIG. 3B is a view for explaining an example (2) of processing a substrate using incubation.
Figure 3C:
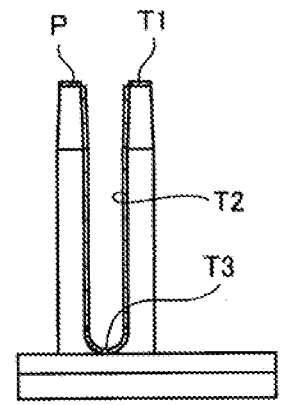
FIG. 3C is a view for explaining an example (3) of processing a substrate using incubation.

Next, an example in which an incubation effect is used in processing a substrate S having a pattern will be described. FIGS. 3A to 3C are views for explaining Examples 1 to 3 of processing of a substrate S using the incubation effect. FIGS. 4A to 4D are views for explaining State Examples 1 to 4 of molecules on the substrate S illustrated in FIGS. 3A to 3C. On the substrate S illustrated in FIGS. 3A to 3C and FIGS. 4A to 4D, a pattern having a top portion T1, a side wall T2, and a bottom portion T3 is formed.

Figure 4A:
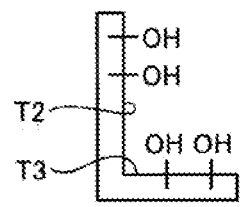
FIG. 4A is a view for explaining an example (1) of the state of molecules on the substrate illustrated in FIG. 3A.
Figure 4B:
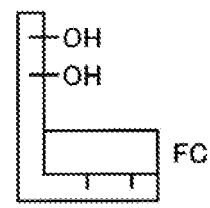
FIG. 4B is a view for explaining an example (2) of the state of molecules on the substrate illustrated in FIG. 3A.

Here, a hydroxy group (OH group) is present on the surface of the substrate S illustrated in FIG. 4A. A polymer film P of fluorocarbon (FC) is formed through CVD on the substrate S having OH groups on the surface thereof (FIG. 3A). The polymer film P functions as an inhibitor of the ALD cycle as described above. Here, by using CVD, a control is performed such that the polymer film P is formed on the top portion T1 and the bottom portion T3 and is not formed on the side wall T2. In the top portion T1 and the bottom portion T3 on which the polymer film P is formed, OH groups are covered with the polymer film P and are not exposed on the surface (FIG. 4B).

Figure 4C:
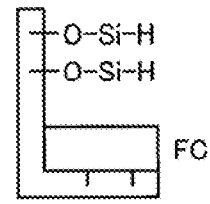
FIG. 4C is a view for explaining an example (3) of the state of molecules on the substrate illustrated in FIG. 3B.

Next, the substrate S is exposed to the precursor gas X (FIG. 3B). It is assumed that the precursor gas X is a gas containing silicon (Si). On the side wall T2 where the OH groups are present on the surface, the Si of the precursor gas X is adsorbed to the OH groups (FIG. 4C). Meanwhile, Si is not adsorbed to the top portion T1 and the bottom portion T3 where OH groups are not present on the surfaces thereof.

Figure 4D:
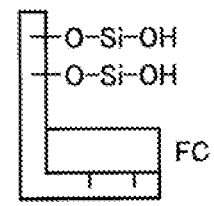
FIG. 4D is a view for explaining an example (4) of the state of molecules on the substrate illustrated in FIG. 3C.

Next, the substrate S is exposed to a reactive gas of ALD (FIG. 3C). The reaction gas is, for example, an oxygen-containing gas or a nitrogen-containing gas. Here, as an example, the description will be made assuming that the reaction gas is $CO_2$ gas. The reaction gas is bonded with Si adsorbed onto the side wall T2 (oxidizes Si) to form a film on the side wall T2 (FIG. 4D). Meanwhile, in the top portion T1 and the bottom portion T3, bonding between the reaction gas and Si does not occur. On the contrary, as the reaction gas is formed into plasma, the polymer film P is etched and thinned. Thus, by controlling the position where the inhibitor is formed through the CVD, it is possible to control the position and thickness distribution of the film formed through the ALD cycle to be performed later. Here, the CVD is described as plasma CVD, but the polymer film P may be formed through CVD not using plasma.

<Example of Plasma Processing Apparatus According to Embodiment>

A plasma processing method and a plasma processing apparatus according to the present embodiment reduce pattern damage in a plasma processing using a film formation control based on the above-described incubation time and the adsorption position of the inhibitor.

Figure 1:
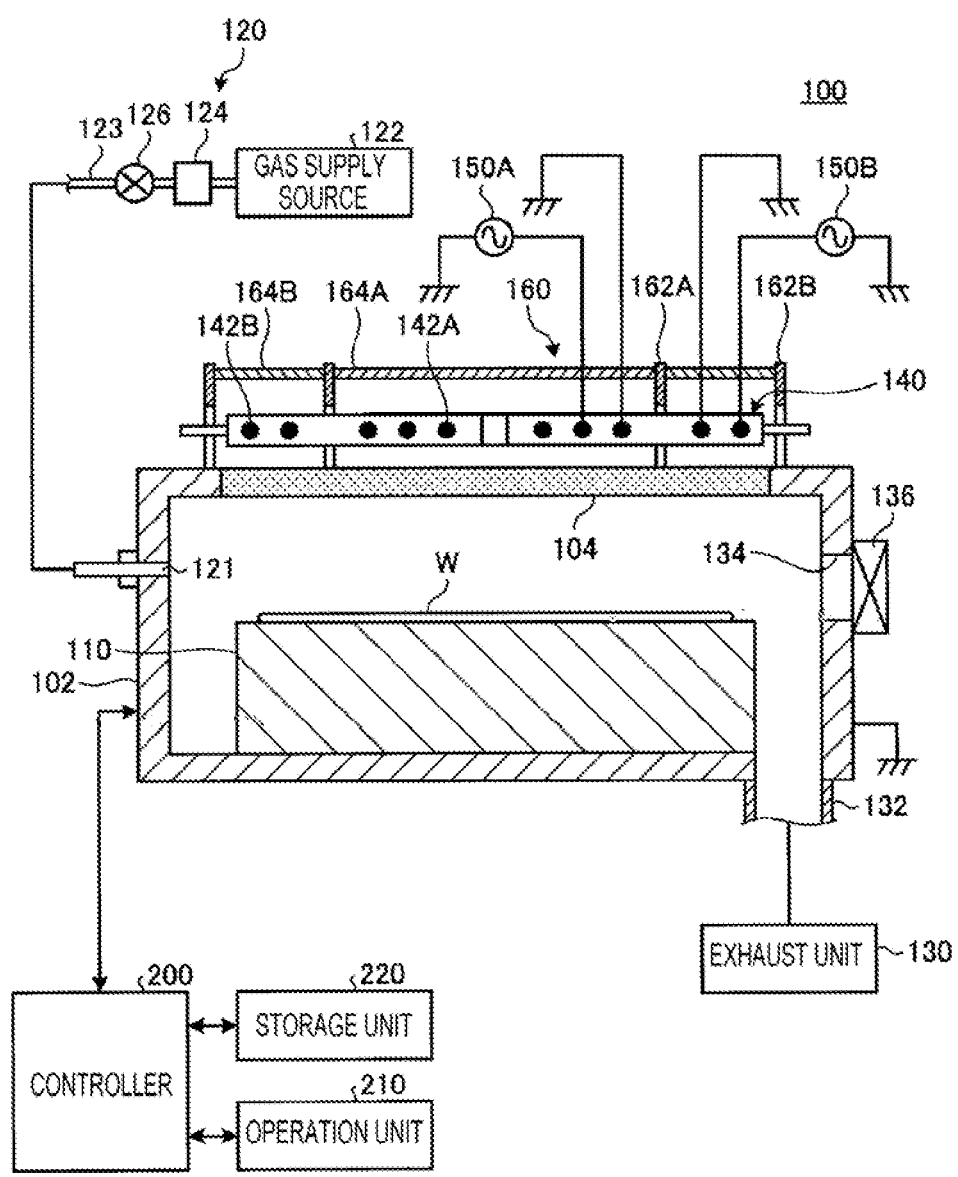
FIG. 1 is a cross-sectional view illustrating a schematic configuration of a plasma processing apparatus according to an embodiment.

FIG. 1 is a cross-sectional view illustrating a schematic configuration of a plasma processing apparatus 100 according to an embodiment. The plasma processing apparatus 100 includes a tubular (e.g., cylindrical) processing chamber 102 made of a metal (e.g., aluminum).

On the bottom portion of the processing chamber 102, a stage 110 is provided to place a wafer W thereon. The stage 110 is formed of, for example, aluminum in a substantially columnar shape (e.g., a cylindrical shape). Although not illustrated, the stage 110 may be provided with various functions as needed, such as, for example, an electrostatic chuck configured to attract and hold a wafer W by electrostatic force, a temperature control mechanism such as, for example, a heater or a coolant channel. In the case of an etching apparatus, bias radio-frequency waves for drawing ions into the wafer W is applied to the stage 110.

A plate-shaped dielectric body 104 made of, for example, quartz glass or ceramic is provided on the ceiling of the processing chamber 102 to face the stage 110. Specifically, the plate-shaped dielectric body 104 is formed, for example, in a disk shape, and is hermetically attached so as to close an opening formed in the ceiling of the processing chamber 102.

The processing chamber 102 is provided with a gas supply 120 that supplies, for example, a processing gas for processing the wafer W. A gas inlet 121 is formed in the side wall of the processing chamber 102, and a gas supply source 122 is connected to the gas inlet 121 through a gas supply pipe 123. A flow rate controller for controlling the flow rate of the processing gas such as, for example, a mass flow controller 124, and an opening/closing valve 126 are interposed in the middle of the gas supply pipe 123. According to such a gas supply unit 120, the processing gas from the gas supply source 122 is controlled to a predetermined flow rate by the mass flow controller (MFC) 124, and is supplied from the gas inlet 121 into the processing chamber 102.

Although the gas supply 120 is represented as a gas line of a single system in FIG. 1 in order to simplify the description, the gas supply 120 is not limited to the case where a processing gas of a single gas species is supplied, and a plurality of gas species may be supplied as processing gases. In this case, a plurality of gas supply sources may be provided to constitute gas lines of multiple systems, and a mass flow controller may be provided for each gas line. In addition, although FIG. 1 illustrates the case where the gas supply 120 is configured to supply the gas from the side wall of the processing chamber 102 as an example, the present disclosure is not necessarily limited thereto. For example, the gas may be supplied from the ceiling of the processing chamber 102. In this case, a gas inlet may be formed in, for example, the central portion of, for example, the plate-shaped dielectric body 104, and the gas may be supplied therefrom.

As a processing gas supplied into the processing chamber 102 by the gas supply 120, for example, a halogen-based gas containing, for example, Cl or F is used in the etching of the oxide film. Specifically, when etching a silicon oxide film such as, for example, a $SiO_2$ film, a fluorocarbon gas such as, for example, $C_xF_y$ or $CHF_3$ gas is used as a processing gas.

An exhaust unit 130 configured to exhaust the atmosphere in the processing chamber 102 is connected to the bottom portion of the processing chamber 102 through an exhaust pipe 132. The exhaust unit 130 is constituted by, for example, a vacuum pump, and is configured to be capable of reducing the pressure in the processing chamber 102 to a predetermined pressure. A wafer loading/unloading port 134 is formed in the side wall of the processing chamber 102, and a gate valve 136 is provided in the wafer loading/unloading port 134. For example, when the wafer W is loaded, the gate valve 136 is opened, the wafer W is placed on the stage 110 in the processing chamber 102 by a transport mechanism such as, for example, a transport arm (not illustrated), and the gate valve 136 is closed so as to perform the processing of the wafer.

A planar radio-frequency antenna 140 and a shield member 160 covering the radio-frequency antenna 140 are disposed on the upper side surface (outer surface) of the plate-shaped dielectric body 104 in the ceiling of the processing chamber 102. The radio-frequency antenna 140 in the present embodiment generally includes an inner antenna element 142A disposed in the central portion of the plate-shaped dielectric body 104 and an outer antenna element 142B disposed so as to surround the outer periphery of the inner antenna element 142B. Each of the antenna elements 142A, 142B is formed in a spiral coil shape using a conductor such as, for example, copper, aluminum, or stainless steel.

The shield member 160 in the present embodiment includes a cylindrical inner shield wall 162A provided between the antenna elements 142A, 142B so as to surround the inner antenna element 142A, and a cylindrical outer shield wall 162B provided so as to surround the outer antenna element 142B. Thus, the upper side surface of the plate-shaped dielectric body 104 is divided into an inner central portion (central zone) inside the inner shield wall 162A and a peripheral edge portion (peripheral edge zone) between the shield walls 162A, 162B.

A disk-shaped inner shield plate 164A is provided on the inner antenna element 142A so as to close the opening in the inner shield wall 162A. A donut plate-shaped outer shield plate 164B is provided on the outer antenna element 142B so as to close the opening between the shield walls 162A, 162B.

Meanwhile, the shape of the shield member 160 is not limited to the cylindrical shape. The shape of the shield member 160 may be another shape such as, for example, a rectangular cylinder shape, but may match the shape of the processing chamber 102. Here, for example, since the processing chamber 102 has a substantially cylindrical shape, the shield member 160 is also formed in a substantially cylindrical shape corresponding thereto.

Radio-frequency power sources 150A, 150B are separately connected to the antenna elements 142A, 142B, respectively. This may make it possible to apply radio-frequency waves having the same frequency or different frequencies to each of the antenna elements 142A, 142B. For example, when radio-frequency waves having a predetermined frequency (e.g., 40 MHz) are supplied at predetermined power from the radio-frequency power supply 150A to the inner antenna element 142A, an induction magnetic field is formed in the processing chamber 102. The formed induction magnetic field excites the processing gas introduced into the processing chamber 102 to generate a donut-shaped plasma in the central portion on the wafer W.

In addition, when radio-frequency waves having a predetermined frequency (e.g., 60 MHz) are supplied at predetermined power from the radio-frequency power supply 150B to the outer antenna element 142B, an induction magnetic field is formed in the processing chamber 102. The formed induction magnetic field excites the processing gas introduced into the processing chamber 102 to generate another donut-shaped plasma in the peripheral edge portion on the wafer W.

By these plasmas, predetermined plasma processings such as, for example, an ashing processing, an etching processing, and a film formation processing, are performed. The radio-frequency waves output from each of the radio-frequency power supplies 150A, 150B are not limited to the frequency described above. For example, radio-frequency waves of various frequencies such as, for example, 13.56 MHz, 27 MHz, 40 MHz, and 60 MHz, may be supplied. However, it is necessary to adjust the electrical length of each antenna element 142A, 142B depending on the radio-frequency waves output from the radio-frequency power sources 150A, 150B.

A controller (overall control device) 200 is connected to the plasma processing apparatus 100, and each part of the plasma processing apparatus 100 is controlled by the controller 200. In addition, the controller 200 is connected with an operation unit 210 including, for example, a keyboard on which an operator performs, for example, a command input operation in order to manage the plasma processing apparatus 100 and a display on which the operating status of the plasma processing apparatus 100 is visualized and displayed.

In addition, the controller 200 is connected with a storage unit 220 which stores a program for implementing various processings executed by the plasma processing apparatus 100 through a control by the controller 200 and recipe data necessary for executing the program.

The storage unit 220 stores, for example, a recipe for performing a processing such as a cleaning processing in the processing chamber 102 in addition to a plurality of process processing recipes for executing the process processing of the wafer W. In these recipes the values of a plurality of parameters such as, for example, control parameters for controlling each part of the plasma processing apparatus 100 and setting parameters. For example, the process processing recipes have parameter values such as, for example, the flow rate ratios of processing gases, the pressures in the processing chamber 102, and the frequencies and powers of radio-frequency waves applied to each of the antenna elements 142A, 142B.

Meanwhile, these recipes may be stored in a hard disk or semiconductor memory, and may be adapted to be set at a predetermined position on the storage unit 220 in the state of being stored in a portable computer-readable storage medium such as, for example, a CD-ROM or a DVD.

The controller 200 executes a desired processing in the plasma processing apparatus 100 by reading out a desired process processing recipe from the storage unit 220 based on, for example, an instruction from the operation unit 210 and controlling each part. In addition, the recipe is adapted to be editable by the operation from the operation unit 210.

Although an inductively coupled plasma (ICP) apparatus is illustrated here as an example, the plasma processing apparatus 100 may be a capacitively coupled plasma (CCP) apparatus. In addition to the radio-frequency antenna 140 provided on the ceiling of the processing chamber 102, radio-frequency power may be supplied to the lower electrode of the stage 110 to generate plasma.

<Example of Flow of Plasma Processing According to Embodiment>

Figure 5:
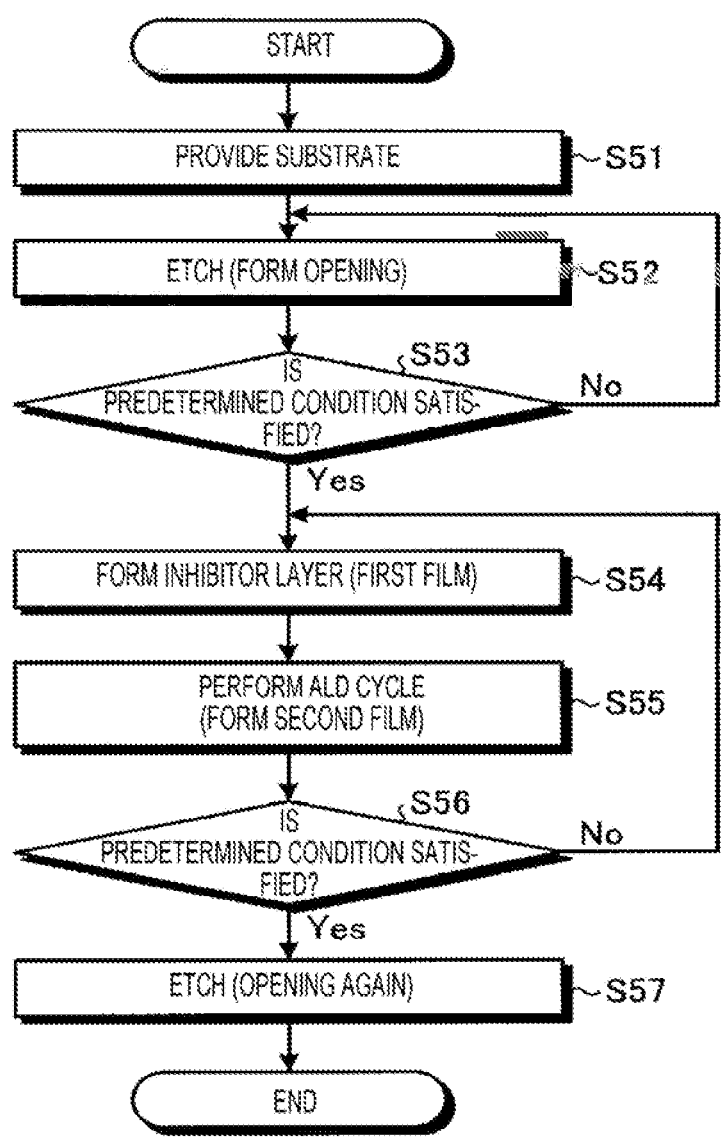
FIG. 5 is a flowchart illustrating an example of a flow of a plasma processing according to an embodiment.

FIG. 5 is a flowchart illustrating an example of a flow of a plasma processing according to an embodiment. First, a wafer W as a substrate is provided and placed on the stage 110 in the processing chamber 102 (step S51). Then, under the control of the controller 200, the plasma processing apparatus 100 executes a processing such as, for example, etching, in order to form, for example, a predetermined opening in the wafer W (step S52). Next, the plasma processing apparatus 100 determines whether a formed pattern, for example, the opening, satisfies predetermined conditions (step S53). When it is determined that the predetermined conditions are not satisfied (step S53, No), the plasma processing apparatus 100 returns to step S52 and continues the processing. Meanwhile, when it is determined that the predetermined conditions are satisfied (step S53, Yes), the plasma processing apparatus 100 forms an inhibitor layer on the wafer W using CVD (step S54). The inhibitor layer is an example of a first film. Next, the plasma processing apparatus 100 executes an ALD cycle (step S55). Meanwhile, in step S55, a plurality of ALD cycles are performed. The film formed through the ALD cycles is an example of a second film. Next, the plasma processing apparatus 100 determines whether the wafer W after execution of the ALD cycles satisfies predetermined conditions (step S56). When it is determined that the predetermined conditions are not satisfied (step S56, No), the plasma processing apparatus 100 returns to step S54 and continues the processing. Meanwhile, when it is determined that the predetermined conditions are satisfied (step S56, Yes), the plasma processing apparatus 100 also performs etching (step S57). The plasma processing according to the embodiment is terminated here.

<Example of Pattern Formed Through Plasma Processing>

Figure 6A:
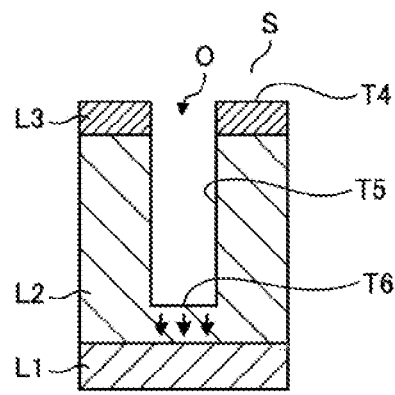
FIG. 6A is a view illustrating an example of a substrate to which a plasma processing according to an embodiment is applied.

FIG. 6A is a view illustrating an example of a substrate to which a plasma processing according to an embodiment is applied. The substrate S in FIG. 6A has a base layer L1, a first layer L2, and a second layer L3. An opening O is formed in the substrate S. After the first layer L2 is formed on the base layer L1 using a film formation method such as, for example, CVD, the second layer L3 which is to serve as a mask when etching the first layer L2 is formed. Next, etching is performed on the second layer L3 to form an opening O. The opening O has a side wall T5 and a bottom portion T6. By this processing, the substrate S of FIG. 6A is formed. In the state of FIG. 6A, the bottom surface (the surface of the bottom portion T6) of the opening O is located in the first layer L2.

Here, it is assumed that the first layer L2 needs to be etched to the vicinity of the base layer L1. In addition, it is assumed that it is desirable to perform the etching without damaging the side wall T5 of the opening O. In addition, it is assumed that it is desirable to perform the etching of the first layer L2 without damaging the base layer L1.

In addition, it is assumed that the base layer L1 and the first layer L2 are formed of different materials. For example, the base layer L1 is formed of silicon dioxide ($SiO_2$), and first layer L2 is formed of, for example, silicon (Si) or silicon nitride (SiN). In addition, the second layer L3 is formed of, for example, $SiO_2$.

Figure 6B:
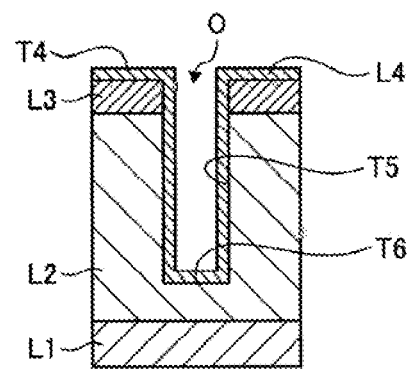
FIG. 6B is a view illustrating an example of a protective layer formed on the substrate illustrated in FIG. 6A.

At this time, in order to suppress the damage imparted to the side wall T5 of the opening O, it is considered that a protective layer is formed on the side wall T5. For example, as illustrated in FIG. 6B, it is possible to form a protective layer L4 of S102 on the substrate S by performing ALD. FIG. 6B is a view illustrating an example of a protective layer formed on the substrate S illustrated in FIG. 6A.

Figure 6C:
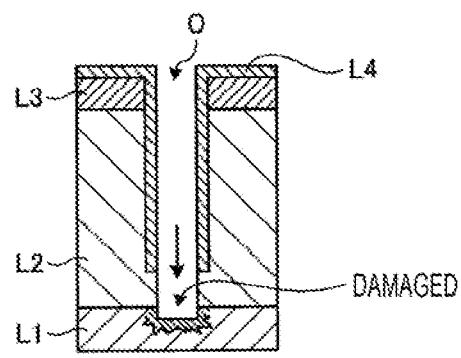
FIG. 6C is a view for explaining the case where etching is performed in an opening in the substrate illustrated in FIG. 6B.

However, when the protective layer L4 illustrated in FIG. 6B is formed, the following problems occur. First, while the material of the protective layer L4 is $SiO_2$, the material of the first layer L2 is Si or SiN. Then, in order to further etch the bottom portion T6, first, the protective layer L4 is removed by performing etching under the conditions suitable for $SiO_2$ which is a material of the protective layer L4, and then the first layer L2 is etched. The process for removing the protective layer L4 is also referred to as a breakthrough process. In the case where the breakthrough process (e.g., $CF_4$, 200 sccm, 30 mTorr, antenna 300 W, 13 MHz, 100 W on a 300 mm wafer W) is performed, when the distance from the surface of the bottom portion T6 to the upper surface of the base layer L1 is short, the base layer L1 may be damaged by the influence of etching for removing the protective layer L4. When it is difficult to control the etching selectivity of the protective layer L4 and the first layer L2, the base layer L1 may be etched together with the base layer L1 when the protective layer L4 is etched. In this case, as illustrated in FIG. 6C, the base layer L1 may be damaged. FIG. 6C is a view for describing the case where etching is performed in the opening O in the substrate S illustrated in FIG. 6B.

On the contrary, in the plasma processing according to the embodiment illustrated in FIG. 5, when it is determined that the opening O satisfies the predetermined conditions (FIG. 5, step S53, Yes), the plasma processing apparatus 100 stops the etching first at that time. Then, the plasma processing apparatus 100 executes the ALD cycle (FIG. 5, step S55) for forming the protective layer after forming the inhibitor layer (FIG. 5, step S54). The inhibitor layer is, for example, a layer that generates an incubation time in the subsequent ALD cycle, as described with reference to FIGS. 6A to 6C. For example, the inhibitor layer is a layer formed of a material that inhibits adsorption of a precursor gas in the subsequent ALD cycle. The inhibitor layer is, for example, a layer having a hydrophobic surface. In addition, for example, the inhibitor layer is a layer containing fluorine (F). In addition, for example, the inhibitor layer is a layer formed of a gas containing fluorocarbon. In addition, for example, the inhibitor layer is a layer formed of a gas not containing hydrogen.

Figure 7A:
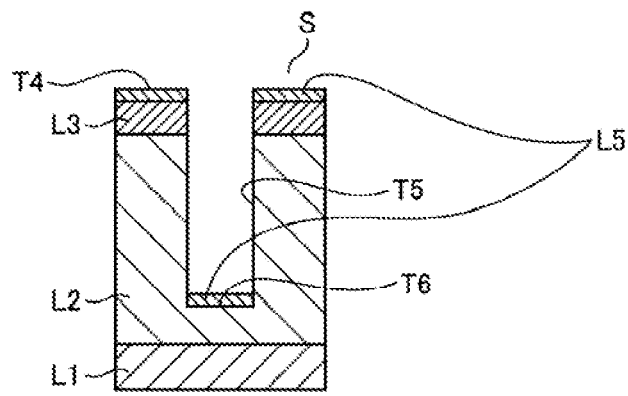
FIG. 7A is a view illustrating an example in the case where an inhibitor layer is formed on the substrate illustrated in FIG. 6A.

FIG. 7A is a view illustrating an example in the case where an inhibitor layer L5 is formed on the substrate S illustrated in FIG. 6A. When it is determined that the opening O satisfies the predetermined condition, the processing for forming the inhibitor layer L5 is performed on the substrate S in which the opening O illustrated in FIG. 6A is formed. Here, the predetermined conditions to be satisfied by the opening O is, for example, that the depth of the opening O has reached a predetermined depth, or that the distance from the surface of the bottom portion T6 of the opening O to the upper surface of the base layer L1 has reached a predetermined distance. It is possible to determine whether or not the predetermined conditions are satisfied based on, for example, whether or not a predetermined time has elapsed from the start of the processing. Here, when the distance from the surface of the bottom portion T6 of the opening O to the upper surface of the base layer L1 has reached a predetermined distance, the plasma processing apparatus 100 determines that the opening O satisfies the predetermined condition. The predetermined distance is a distance at which it is determined that there is a possibility that damage is caused to the base layer L1 when the breakthrough process is performed at the distance or less. For example, the predetermined distance is 20 nanometers (nm).

The formation of the inhibitor layer L5 is performed by depositing fluorocarbon on a predetermined portion of the pattern of the substrate S through, for example, CVD. For example, by using anisotropic CVD, FC is deposited generally in one direction, and FC is not deposited in a direction different from the one direction. For example, while the FC is deposited in a direction orthogonal to the upper surface of the substrate S, the FC is not deposited in the direction horizontal to the upper surface. In the example of FIG. 7A, the inhibitor layer L5 is formed on the top portion T4 and the bottom portion T6, but the inhibitor layer L5 is not formed on the side wall T5.

Figure 7B:
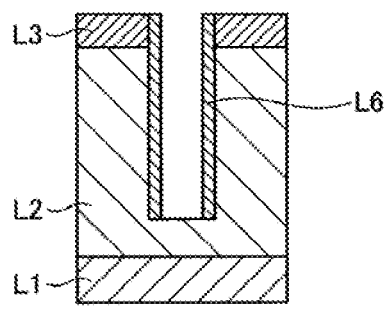
FIG. 7B is a view illustrating an example in which a protective layer is formed using the inhibitor layer of the substrate illustrated in FIG. 7A.

Next, the plasma processing apparatus 100 executes an ALD cycle (FIG. 5 step S55). That is, the plasma processing apparatus 100 exposes the substrate S on which the inhibitor layer L5 is formed to the precursor gas X, and causes the precursor gas X to be adsorbed to the portion on which the inhibitor layer L5 is not formed. For example, in the example of FIG. 7A, the precursor gas X is adsorbed to the side wall T5 on which the inhibitor layer L5 is not formed. In addition, the plasma processing apparatus 100 exposes the substrate S to the reaction gas. Then, the atoms of the precursor gas X and the atoms of the reaction gas, which are adsorbed on the side wall T5, are bonded to each other so as to form the protective layer L6. FIG. 7B is a view illustrating an example in which the protective layer L6 is formed using the inhibitor layer L5 of the substrate S illustrated in FIG. 7A. The protective layer L6 is formed at a position where the inhibitor layer L5 is not formed. In the example of FIG. 7B, the protective layer L6 is formed on the side wall T5 of the opening O. Meanwhile, the example of FIG. 7B is a state after repeated execution of the ALD cycle until the inhibitor layer L5 is removed.

Next, when it is determined that the predetermined conditions are satisfied as a result of ALD (FIG. 5, step S56, Yes), the plasma processing apparatus 100 etches the opening O of the substrate S on which the protective layer L6 is formed (FIG. 5, step S57).

In the case of the example illustrated in FIG. 7B, unlike the example illustrated in FIG. 6B, the protective layer L6 is not formed on the bottom portion T6 of the opening O. Therefore, it is possible to directly etch the first layer L2 immediately after the determination in step S56. Therefore, it is possible to perform the etching under the conditions suitable for the etching of the first layer L2 without the intervention of the breakthrough step. In addition, it is possible to set the etching conditions such that a selection ratio is obtained between the base layer L1 and the first layer L2.

Figure 7C:
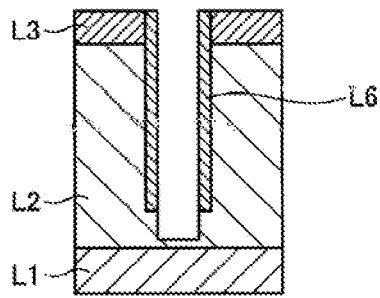
FIG. 7C is a view for explaining the case where etching is performed in an opening in the substrate illustrated in FIG. 7B.

FIG. 7C is a view for describing the case where etching is performed in the opening O in the substrate S illustrated in FIG. 7B. By etching the substrate S of FIG. 7B, it is possible to suppress damage to the base layer L1 even if the first layer L2 is etched to the vicinity of the base layer L1 as illustrated in FIG. 7C. In addition, since the side wall T5 is protected by the protective layer L6 during the etching, it is possible to eliminate damage (bowing) to the side wall T5.

<Formation Position of Inhibitor Layer>

In the example illustrated in FIGS. 7A to 7C, it is assumed that the inhibitor layer L5 is formed on the top portion T4 and the bottom portion T6. The position where the inhibitor layer is formed and the film thickness distribution may be changed by changing the conditions of plasma CVD (e.g., whether it is isotropic or anisotropic). Therefore, when the inhibitor layer L5 is formed on the top portion T4 and the bottom portion T6 as in the embodiment described above, the conditions of plasma CVD are appropriately selected from, for example, the following conditions to form the inhibitor layer L5.

(Gas Species)

For example, it is possible to adjust the formation position and film thickness distribution of the inhibitor layer by changing the gas species used in CVD. As a gas for forming the inhibitor layer through the CVD, $C_4F_6$ gas or $C_4F_8$ gas may be used. The attachment coefficient of the $C_4F_6$ gas is larger than that of the $C_4F_8$ gas. Therefore, when the $C_4F_6$ is used, the inhibitor layer is formed more on the surface side (the low aspect area) of the wafer W. Meanwhile, when the $C_4F_8$ is used, the inhibitor layer is formed more on the bottom portion (high aspect area). Here, the low aspect area refers to an area relatively close to the surface of the wafer W, and the high aspect area refers to an area relatively far from the surface of the wafer W. Since the attachment coefficient differs depending on the gas species as described above, it is possible to control the formation position of the inhibitor layer by changing the gas species.

(Bias Power)

Further, by changing the power of the bias radio-frequency power source applied to the stage 110, it is possible to adjust the formation position and the film thickness distribution of the inhibitor layer. For example, the power may be turned on/off. In addition, the value of the power may be changed between a high value and a low value. When the value of the power increases, the inhibitor layer is thickly formed on a horizontal surface in the wafer W (e.g., the top portion T4 and the bottom portion T6 in FIG. 6A). Meanwhile, the inhibitor layer is thinly formed on the vertical surface of the wafer W (e.g., the side wall T5 in FIG. 6A). When the value of the power is reduced, the inhibitor layer is formed more on the upper side, i.e., at a position relatively closer to the surface of the wafer W.

(Wafer Temperature)

In addition, by changing the temperature of the wafer W when forming the inhibitor layer, it is possible to adjust the formation position and the film thickness distribution of the inhibitor layer. When the temperature of the wafer W becomes relatively high, the inhibitor layer is formed more on the bottom side (high aspect area). When the temperature of the wafer W becomes relatively low, the inhibitor layer is formed on the surface side (low aspect area) of the wafer W.

(Pressure)

In addition, by changing the pressure within the processing chamber 102 when forming the inhibitor layer, it is possible to adjust the formation position and the film thickness distribution of the inhibitor layer. When the pressure within the processing chamber 102 relatively increases, the generated plasma is isotropic. A thick inhibitor layer is formed on the surface side (low aspect area) of the wafer W by the isotropic plasma. Meanwhile, when the pressure in the processing chamber 102 is relatively low, the generated plasma is anisotropic. By the anisotropic plasma, a thicker inhibitor layer is formed on the bottom side (high aspect area).

(Radio-Frequency Power for Plasma Generation)

In addition, it is possible to adjust the formation position and film thickness distribution of an inhibitor layer by changing the value of the radio-frequency power for plasma excitation used in the plasma CVD. By changing the value of the radio-frequency power for plasma excitation, it is possible to change the dissociation state of plasma. Therefore, by changing the power, the radical species or radical ratio generated in the plasma CVD is changed, and the attachment coefficient when the inhibitor layer is formed is changed. When the value of the radio-frequency power is changed so as to increase the attachment coefficient, the inhibitor layer is formed more on the surface side (low aspect area) of the wafer W. In addition, when the value of the radio-frequency power is changed so as to decrease the attachment coefficient, the inhibitor layer is formed more on the bottom side (low aspect area) of the wafer W.

(Inhibitor Layer Formation without Ions)

The inhibitor layer L5 of FIG. 7A is formed on the top portion T4 and the bottom portion T6. However, when the aspect ratio of a pattern increases and the opening size of the pattern decreases, opening blocking may occur when the inhibitor layer L5 is formed on the bottom portion T6 through the CVD. In order to feed a processing gas for forming the inhibitor layer L5 to the bottom portion T6, it is considered that the processing conditions are set so as to increase the ion energy in the CVD. However, when the ion energy is set high, there is a possibility that the base layer L1 is damaged when forming the inhibitor layer L5.

Therefore, in the case of forming an inhibitor layer on the bottom portion of a pattern having a high aspect ratio, the processing may be performed under an ionless processing condition or under a processing condition in which the ion energy is set low. For example, a processing using capillary condensation may be employed. The capillary condensation refers to the phenomenon in which the saturation vapor pressure in a capillary tube or pore is lower than that of a flat surface. In other words, the capillary condensation is a phenomenon in which gas condenses into liquid when it comes into contact with a capillary tube having a temperature of the critical point or less. From a capillary condensation equation, it is known that the smaller the radius of the capillary tube becomes, the smaller the vapor pressure in the capillary tube becomes and thus condensation is more likely to occur. When this is applied to a semiconductor pattern, it can be said that as the aspect ratio of a pattern increases (as the radius of a capillary tube decreases), the vapor pressure in the pattern also decreases and thus condensation is more likely to occur. By utilizing this phenomenon, it is possible to cause the liquefaction and/or solidification of the processing gas to occur preferentially in a pattern having a small opening among the patterns of a substrate. Such an approach is particularly effective when forming an inhibitor layer on the bottom portion of a high aspect ratio pattern.

FIGS. 8A to 8D are views for explaining an example of a method of forming an inhibitor layer using capillary condensation. The test results of FIGS. 8A to 8D were obtained by conducting a test under the following processing condition 1. In the test, samples in each of which a silicon nitride film was formed on a wafer were used. Recesses and flat portions with an aspect ratio of 3 to 5 were formed in advance in the silicon nitride film. In the test, an inductively coupled plasma processing apparatus was used in which radio-frequency waves HF for plasma generation were supplied in the upper side of the processing chamber and radio-frequency waves LF for bias drawing-in were supplied to the stage.

<Processing Condition 1>

Pressure in chamber: 50 mTorr (6.65 Pa)
Gas type/flow rate: $C_4F_6$, 300 sccm
Stage temperature: −50° C.
Power of radio-frequency waves HF: 300 W
Power of radio-frequency waves LF: 0 W In FIGS. 8A to 8D respectively illustrate patterns obtained by setting the processing time to 2 sec, 4 sec, 7 sec, and 10 sec. In each of FIGS. 8A to 8D, the recesses A to G and the flat portion H have substantially the same depth. The opening dimensions of the recesses A, C, E are substantially the same, and the opening dimensions of the recesses B and D are also substantially the same. The recess F has a smaller opening size than the recesses A to E. The recess G has a larger opening size than the recess A and a smaller opening size than the recess B. For this reason, the aspect ratios of respective recesses are higher in the order of the recesses B and D, the recess G, the recesses A, C, E, and the recess F.

In FIG. 8A, the recess F having an aspect ratio higher than that of each of the recesses A, C, E is filled with the CF film earlier than the recesses A, C, E. In addition, since the CF film fills the recess F as a flowable organic film, the opening of the recess F is not blocked.

Further, in FIG. 8B, since the CF film is not deposited in the recesses B and D, the recesses A, C, E are filled with the CF film, and the recess G is also filled with the CF film. In the state of FIG. 8B, the CF film is hardly formed on the flat portion H.

In FIG. 8C, deposition of the CF film is also observed in the flat portion H. In FIG. 8D, the recesses A to G are substantially filled with the CF film, and a large amount of the CF film is deposited on the flat portion H as well. As can be seen from FIGS. 8A to 8D, in the method using capillary condensation, a high aspect ratio pattern is filled with the CF film earlier than a low aspect ratio pattern. In other words, the higher the aspect ratio, the higher the deposition rate. In addition, the recesses are filled with the CF film such that the CF film grows from the bottom surfaces of the recesses. Therefore, by adjusting the processing time using capillary condensation, it is possible to form the CF film without damaging the base layer.

Figure 9A:
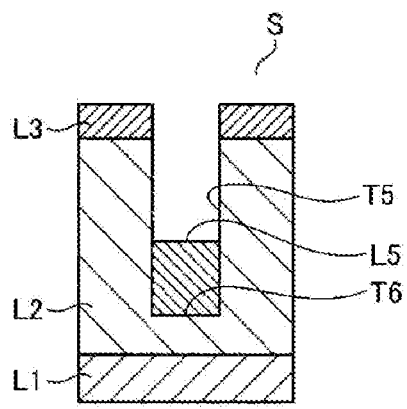
FIG. 9A is a view illustrating an example of a substrate on which an inhibitor layer is formed using capillary condensation.
Figure 9B:
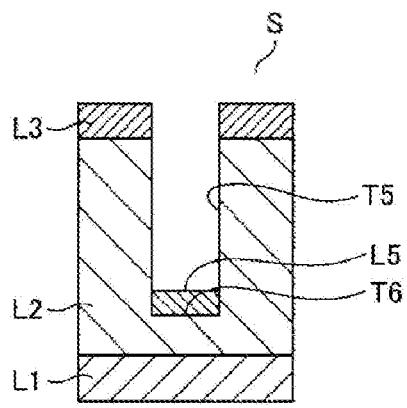
FIG. 9B is a view illustrating an example of a state in which ashing is performed on the substrate shown in FIG. 9A.
Figure 9C:
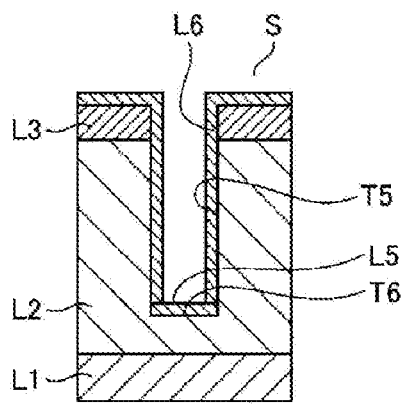
FIG. 9C is a view illustrating an example of a state in which a protective layer is formed on the substrate shown in FIG. 9B.

FIG. 9A is a view illustrating an example of a substrate S in which the inhibitor layer L5 is formed using capillary condensation. FIG. 9B is a view illustrating an example in the state in which ashing is performed on the substrate S illustrated in FIG. 9A. FIG. 9C is a view illustrating an example in the state in which a protective layer L6 is formed on the substrate S illustrated in FIG. 9B.

First, the inhibitor layer L5 is formed on the substrate S using capillary condensation. Since the inhibitor layer L5 is formed at a very low temperature and without ions, it is possible to suppress damage to the base layer L1 and the first layer L2. Thereafter, ashing is performed to adjust the film thickness of the inhibitor layer L5. Ashing may be omitted. Thereafter, the protective layer L6 is formed through ALD. Thus, when the inhibitor layer L5 is formed using capillary condensation, it is possible to prevent opening blockage and damage to the base layer.

<Temperature Dependence and Pressure Dependence of Processing Using Capillary Condensation>

Meanwhile, when forming an inhibitor layer such that the inhibitor piles up from the bottom portion of a pattern bottom using capillary condensation, the formed inhibitor layer has temperature dependence and pressure dependence. For this reason, the processing is performed while controlling the temperature and pressure during the processing. For example, the processing is performed while controlling the temperature of the stage 110 is controlled to a very low temperature range of, for example, about −70° C. to −20° C. The pressure in the processing chamber 102 is set to, for example, 50 mTorr or higher. The processing conditions are adjusted so as to achieve a low ion amount of Ei<10 eV or less. For example, the temperature of the stage 110 may be set to −20° C. or lower, and the pressure in the processing chamber 102 may be set to 50 mTorr or higher.

As an example, the flow rate of $C_4F_6$ was set to 300 sccm, the pressure in the processing chamber 102 was set to 100 mTorr, and an inhibitor layer was formed while changing the temperature of the stage 110. In this case, at −10° C. and −20° C., a film was formed isotropically, and the opening was narrowed to generate voids. The voids are cavities formed inside the recess by closing the opening. Meanwhile, at −30° C. and −50° C., an inhibitor layer was formed to pile up from the bottom portion of the pattern, and no void was observed.

Meanwhile, when the flow rate of $C_4F_6$ gas was set to 300 sccm and the pressure in the processing chamber 102 was set to 50 mTorr, voids was generated at −10° C. and a film was formed isotropically. Meanwhile, at −20° C., −30° C., and −50° C., an inhibitor layer was formed to pile up from the bottom portion of the pattern.

When the flow rate of $C_4F_6$ gas was set to 125 sccm and the pressure in the processing chamber 102 was set to 50 mTorr, voids were generated at −10° C. and −20° C. and a film was formed isotropically. At −30° C., an inhibitor layer was formed to pile up from the bottom portion of the pattern.

When the flow rate of isopropyl alcohol (IPA) ($C_3H_8O$) gas was set to 75 sccm and the pressure in the processing chamber 102 was set to 50 mTorr, voids were generated at −10° C. and −30° C. and a film was formed isotropically. At −40° C. and −50° C., a flowable film was formed in a bottom-up fashion.

Thus, the processing conditions for forming an inhibitor layer on the bottom portion of the pattern in a bottom-up fashion vary depending on a gas species, a pressure, and a gas flow rate. However, when at least the flow rate of $C_4F_6$ gas is set to 300 sccm, it is possible to implement bottom-up film formation by maintaining the temperature of the stage 110 at a very low temperature of −20° C. or lower and maintaining the pressure in the processing chamber 102 at 50 mTorr or higher.

As the gas species, a gas having a vapor pressure at a temperature equal to or higher than the temperature indicated by the vapor pressure curve of $C_4F_6$ gas is used. For example, $C_4F_8$, $C_4F_6$, and isopropyl alcohol (IPA) have a vapor pressure at a temperature equal to or higher than the temperature indicated by the vapor pressure curve of $C_4F_8$ gas. A film is formed on a wafer W using these gases. Meanwhile, plasma may or may not be generated during the film formation. Meanwhile, the gas may be a carbon-containing gas.

As described above, by changing the processing conditions and the gas species to be used, it is possible to form an inhibitor layer having a desired film thickness distribution at a desired position and to perform a plasma processing. In addition, it is possible to form a pattern while suppressing damage to a base layer.

Effect of Embodiment

As described above, the plasma processing method according to the embodiment includes an opening formation step (step S52), a first film formation step (step S54), a second film formation step (step S55), and an etching step (step S57). In the opening formation step, the plasma processing apparatus 100 forms an opening O in the first layer S2 by performing etching on the substrate S including the base layer L1 and the first layer L2 formed on the base layer L1. Furthermore, when it is determined that the opening O satisfies the predetermined condition, the plasma processing apparatus 100 executes the first film formation step. In the first film formation step, the plasma processing apparatus 100 forms a first film (the inhibitor layer L5) on the bottom surface T6 of the opening O on which a predetermined gas species is not adsorbed by forming an inhibitor on the bottom surface T6 of the opening O. After the formation of the first film, the plasma processing apparatus 100 forms a second film (the protective layer L4) on the side wall T5 of the opening O through atomic layer deposition using a predetermined gas species as a precursor gas in the second film formation step. Then, the plasma processing apparatus 100 etches the opening O in the etching step. Therefore, the side wall T5 of the opening O is protected by the second film and is not damaged by etching. Further, since the breakthrough step is not necessary in the bottom portion T6 of the opening O, the plasma processing apparatus 100 is able to etch the opening with high accuracy without damaging the base layer L1. Thus, the plasma processing method according to the embodiment is able to reduce damage to a pattern in the plasma processing.

The plasma processing method of the embodiment described above further includes a determination step (FIG. 5, step S53) of determining whether the distance between the bottom surface T6 of the opening O and the surface of the base layer L1 is equal to or less than a predetermined distance. Then, in the plasma processing method, when it is determined that the distance is equal to or less than the predetermined distance (FIG. 5, step S53, Yes), the first film formation step (FIG. 5, step S54) and the second film formation step (FIG. 5, step S55) are performed.

The predetermined distance in the determination step of the plasma processing method of the embodiment described above is, for example, 20 nm. By setting the execution timing of the first film formation step and the second film formation step to be when the distance between the bottom portion T6 and the surface of the base layer L1 is 20 nm or less, the plasma processing apparatus 100 forms a protective layer at a position where it is desired to protect the base layer against damage. In addition, the plasma processing apparatus 100 may appropriately set the etching conditions for the first layer L2 after the bottom portion T6 and the base layer L1 become close to each other.

In addition, in the second film formation step of the plasma processing method of the embodiment described above, the ALD cycle is repeatedly performed a predetermined number of times. For this reason, according to the present embodiment, it is possible to form a second film having a desired thickness and to reduce damage caused due to the subsequent etching.

Moreover, each step of the plasma processing method of the embodiment described above is performed in the same chamber. For this reason, according to the present embodiment, it is possible to save time and effort for, for example, moving a substrate from a chamber in order to perform a processing for each step.

In addition, in the plasma processing method of the embodiment described above, each step is performed on a substrate S in which the base layer L1 and the first layer L2 are made of different materials. For this reason, according to the present embodiment, for a substrate S that usually requires a breakthrough step, it is possible to reduce damage to the substrate S while saving time and effort of the breakthrough step as well.

In the second film formation step of the plasma processing method of the embodiment described above, the second film L6 is formed of a material different from that of the first layer L2. For this reason, according to the present embodiment, it is possible to perform a processing by setting a selection ratio so as not to damage the portion protected by the second film L6 during the etching of the first layer L2.

In the plasma processing method of the embodiment described above, each step is performed on a substrate S in which the base layer L1 is formed of $SiO_2$ and the first layer L2 is formed of SiN or Si, and the second film formation step is performed to form the second film L6 of a $SiO_2$ film. In the plasma processing method of the embodiment described above, each step is performed on a substrate S in which the base layer L1 is formed of Si and the first layer L2 is formed of $SiO_2$, and the second film formation step is performed to form the second film L6 of SiN. For this reason, according to the present embodiment, it is possible to reduce damage imparted to a pattern for the widely used semiconductor device materials.

<Modification>

In the embodiment described above, the formation of the inhibitor layer L5 is started when the distance between the surface of the bottom portion T6 of the opening O and the surface of the base layer L1, which are included in the substrate S, is 20 nm or less. Without being limited to this, for example, the plasma processing apparatus 100 may be configured so as to start the formation of the inhibitor layer L5 when it is determined that damage has occurred to the base layer L1.

Figure 10A:
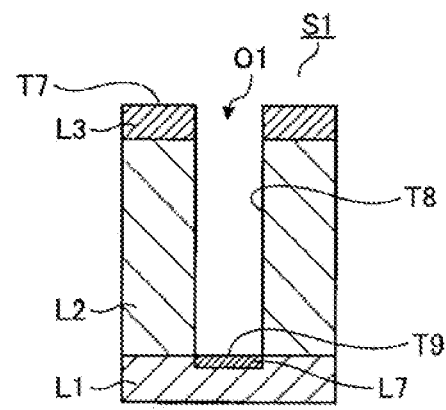
FIG. 10A is a view illustrating an example of a substrate to which a plasma processing according to a modification is applied.

FIG. 10A is a view illustrating an example of a substrate to which a plasma processing according to a modification is applied. Likewise, the substrate S of FIG. 6A, the substrate S1 of FIG. 10A has a base layer L1, a first layer L2, and a second layer L3. However, in the substrate S1, the bottom surface T9 of an opening O1 formed in the first layer L2 reaches the base layer L1. In addition, the bottom surface T9 of the opening O1 formed in the base layer L1 is formed as a damaged layer L7 oxidized by etching.

The flow of the plasma processing according to the modification is the same as the flow of the plasma processing according to the embodiment illustrated in FIG. 5. However, in the modification, a predetermined condition in step S53 is that the damaged layer (an oxide layer) L7 is formed in the bottom portion T9 of the opening O1 located in the base layer L1. Meanwhile, determination as to whether or not the damaged layer L7 is formed may be made based on, for example, the light emission state of plasma and the processing time of etching. For example, the time for the bottom portion T9 of the opening O1 to reach the base layer L1 by etching is set in the storage unit 220 of the plasma processing apparatus 100 as the processing time for etching performed in step S52. Then, the plasma processing apparatus 100 determines that the predetermined condition of step S53 is satisfied when the etching processing time is over.

Figure 10B:
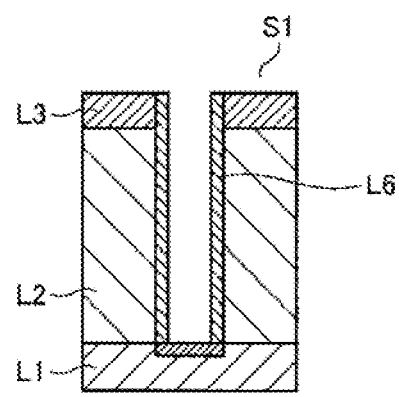
FIG. 10B is a view illustrating an example in which a protective layer is formed on the substrate illustrated in FIG. 10A through the plasma processing according to the modification.
Figure 10C:
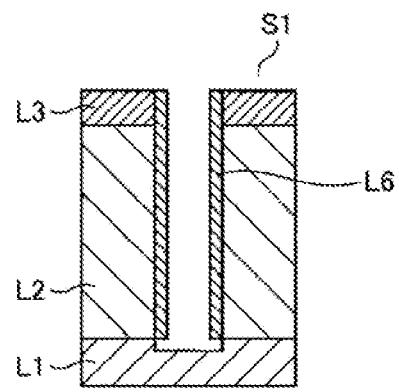
FIG. 10C is a view illustrating an example in which a damaged layer is removed from the substrate illustrated in FIG. 10B through the plasma processing according to the modification.

In the plasma processing according to the modification, when it is determined that the damaged layer L7 is formed in the bottom portion T9 of the opening O1 located in the base layer L1 as a result of the etching (step S52) for forming the opening O1 (step S53, Yes), the inhibitor layer L5 is formed. The flow of formation of the inhibitor layer L5 and the subsequent processing of ALD are the same as the plasma processing according to the embodiment. Even in the case of the modification, the inhibitor layer L5 is formed through CVD on the top portion T7 and the bottom portion T9 of the substrate S1. Thereafter, the protective layer L6 is formed on the side wall T8 where the inhibitor layer L5 is not formed (see FIG. 10B). FIG. 10B is a view illustrating an example in which a protective layer is formed on the substrate S illustrated in FIG. 10A through the plasma processing according to the modification. Then, a processing for removing the damaged layer L7 from above the protective layer L6 is performed. For example, the damaged layer L7 is removed using etching such as, for example, chemical oxide removal (COR). In the COR, for example, HF gas, $NF_3$ gas, or $NH_3$ gas may be used. Alternatively, wet removal may be performed using, for example, hydrofluoric acid. This suppresses damage from further increasing due to the removal of the damaged layer L7 (see FIG. 10C). FIG. 10C is a view illustrating an example in which a damaged layer is removed from the substrate illustrated in FIG. 10B through the plasma processing according to the modification.

Meanwhile, the flow illustrated in FIG. 5 is an example, and the plasma processing according to the embodiment may include other steps. In addition, depending on the contents of the predetermined conditions in steps S53 and S56, processing steps and processing orders different from those illustrated may be adopted.

<Effect of Modification>

The plasma processing method according to the modification described above includes an opening formation step (step S52), a first film formation step (step S54), a second film formation step (step S55), and an etching step (step S57). In the opening formation step, the plasma processing apparatus 100 forms an opening O1 in a first layer S2 by performing etching on a substrate S1 including a base layer L1 and a first layer L2 formed on the base layer L1. Furthermore, when it is determined that the opening O1 satisfies the predetermined conditions, in the first film formation step, the plasma processing apparatus 100 forms the first film (the inhibitor layer L5) to which a predetermined gas species is not adsorbed, through chemical vapor deposition. The plasma processing apparatus 100 forms the first film by forming an inhibitor on the bottom surface T9 of the opening O1. After the formation of the first film, the plasma processing apparatus 100 forms a second film (the protective layer L6) on the side wall T8 of the opening O1 through atomic layer deposition using a predetermined gas species as a precursor gas in the second film formation step. Then, the plasma processing apparatus 100 etches the opening O1 in the etching step. The plasma processing apparatus 100 executes the first film formation step and the second film formation step when the etching step is completed (assuming that the damaged layer L7 is formed). Then, the plasma processing apparatus 100 removes the damaged layer L7 in the etching step. For this reason, according to this modification, even when an undesired damaged layer L7 is formed in the processing process, it is possible to remove the damaged layer L7 without damaging other portions.

Meanwhile, in the foregoing description, the combination of a base layer $SiO_2$, a first layer SiN or Si, and a second film $SiO_2$ is represented as one combination example of materials of the base layer L1, the first layer L2, and the second film L6. Moreover, the combination of a base layer Si, a first layer $SiO_2$, and a second film SiN is represented as another combination example. However, without being limited to these combinations, the plasma processings according to the present embodiment and the modification are applicable to a substrate made of other materials.

According to the present disclosure, it is possible to reduce damage to a pattern in a plasma processing.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing apparatus comprising:
  a chamber having at least one gas inlet and at least one gas outlet;
  a substrate support disposed in the chamber; and
  a controller configured to cause:
    (a) placing a substrate on the substrate support, the substrate including a base layer and a first layer formed on the base layer;
    (b) etching the first layer to form a recess in the first layer;
    (c) when determined that the recess satisfies a predetermined condition, forming a first film on a bottom surface of the recess by forming an inhibitor on the bottom surface of the recess, a predetermined gas species being not adsorbed to the first film;
    (d) after (c), forming a second film on a side wall of the recess using the predetermined gas species as a precursor gas, the first film being formed of a material different from a material forming the second film; and
    (e) etching the first layer through the recess.

2. The substrate processing apparatus according to claim 1, wherein (d) includes:
  (i) exposing the substrate to a precursor gas including the predetermined gas species such that the precursor gas is adsorbed onto the side wall of the recess; and
  (ii) exposing the substrate to a plasma generated from a reactive gas, thereby forming the second film from the precursor gas and the reactive gas.

3. The substrate processing apparatus according to claim 2, wherein (i) and (ii) are repeatedly performed a predetermined number of times in (d).

4. The substrate processing apparatus according to claim 2, wherein (c) and (d) are performed when determined that a damaged layer is formed, and the damaged layer is removed in (e).

5. The substrate processing apparatus according to claim 4, wherein (i) and (ii) are repeatedly performed a predetermined number of times in (d).

6. The substrate processing apparatus according to claim 5, wherein (a) through (e) are performed in a same chamber.

7. The substrate processing apparatus according to claim 6, wherein (a) through (e) are performed on the substrate in which the base layer and the first layer are formed of different materials.

8. The substrate processing apparatus according to claim 6, wherein (a) through (e) are performed on the substrate in which the base layer is formed of Si and the first layer is formed of $SiO_2$, and in (d), the second film is formed of SiN.

9. The substrate processing apparatus according to claim 4, wherein (a) through (e) are performed on the substrate in which the base layer is formed of $SiO_2$ and the first layer is formed of SiN or Si, and in (d), the second film is formed of $SiO_2$.

10. The substrate processing apparatus according to claim 1, wherein the controller is further configured to cause:
  determining whether or not a distance between the bottom surface of the recess and a surface of the base layer is equal to or smaller than a predetermined distance, and
  wherein (c) and (d) are performed when determined that the distance is equal to or smaller than the predetermined distance.

11. The substrate processing apparatus according to claim 10, wherein the predetermined distance is 20 nanometers.

12. The substrate processing apparatus according to claim 1, wherein (a) through (e) are performed in a same chamber.

13. The substrate processing apparatus according to claim 1, wherein (a) through (e) are performed on the substrate in which the base layer and the first layer are formed of different materials.

14. The substrate processing apparatus according to claim 1, wherein (a) through (e) are performed on the substrate in which the base layer is formed of $SiO_2$ and the first layer is formed of SiN or Si, and in (d), the second film is formed of $SiO_2$.

15. The substrate processing apparatus according to claim 1, wherein (a) through (e) are performed on the substrate in which the base layer is formed of Si and the first layer is formed of $SiO_2$, and in (d), the second film is formed of SiN.

16. The substrate processing apparatus according to claim 1, wherein in (c), the first film is formed through chemical vapor deposition.

17. The substrate processing apparatus according to claim 1, wherein in (c), the first film is formed using capillary condensation through chemical vapor deposition.

18. A substrate processing apparatus comprising:
a chamber having at least one gas inlet and at least one gas outlet;
a substrate support disposed in the chamber; and
a controller configured to cause:
  (a) placing a substrate on the substrate support, the substrate including a base layer and a first layer formed on the base layer, the first layer having a recess that satisfies a predetermined condition;
  (b) forming a first film on a bottom surface of the recess, the first film including an inhibitor by which a predetermined gas species is not adsorbed to the first film;
  (c) after (b), forming a second film on a side wall of the recess using the predetermined gas species as a precursor gas, the first film being formed of a material different from a material forming the second film; and
  (d) etching the substrate through the recess.

19. A substrate processing apparatus comprising:
a chamber having at least one gas inlet and at least one gas outlet;
a substrate support disposed in the chamber; and
a controller configured to cause:
  (a) placing a substrate on the substrate support, the substrate including a base layer and a first layer on the base layer;
  (b) etching the first layer to form a recess in the first layer;
  (c) determining whether the recess satisfies a predetermined condition;
  (d) forming a first film on a bottom of the recess by an inhibitor in response to determining that the recess satisfies the predetermined condition;
  (e) forming a second film on a sidewall of the recess by gas species without absorbing the gas species to the first film on the bottom of the recess, the first film being different from the second film; and (f) etching the first layer through the recess.

* * * * *